(12) United States Patent
Yu et al.

(10) Patent No.: US 9,570,130 B2
(45) Date of Patent: Feb. 14, 2017

(54) MEMORY SYSTEM AND MEMORY PHYSICAL LAYER INTERFACE CIRCUIT

(71) Applicant: Realtek Semiconductor Corporation, Hsinchu (TW)

(72) Inventors: Chun-Chi Yu, Hsinchu County (TW); Chih-Wei Chang, Hsinchu County (TW); Gerchih Chou, San Jose, CA (US); Fu-Chin Tsai, Taipei (TW); Shih-Chang Chen, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/093,758

(22) Filed: Apr. 8, 2016

(65) Prior Publication Data

US 2016/0329085 A1 Nov. 10, 2016

(30) Foreign Application Priority Data

May 6, 2015 (TW) .............................. 104114469 A

(51) Int. Cl.
*G11C 7/22* (2006.01)
(52) U.S. Cl.
CPC *G11C 7/222* (2013.01); *G11C 7/22* (2013.01)
(58) Field of Classification Search
CPC .......... G11C 7/22; G11C 7/222; G11C 7/1072
USPC .................... 365/191, 233.1, 233.11, 233.12
See application file for complete search history.

(56) References Cited

U.S. PATENT DOCUMENTS

| | | | | |
|---|---|---|---|---|
| 2008/0320215 | A1* | 12/2008 | Kashiwa | G11C 7/10 |
| | | | | 711/105 |
| 2009/0219770 | A1* | 9/2009 | Shin | G11C 7/1051 |
| | | | | 365/191 |
| 2010/0118626 | A1* | 5/2010 | Maeda | G11C 7/22 |
| | | | | 365/193 |
| 2011/0235459 | A1* | 9/2011 | Ware | G11C 7/04 |
| | | | | 365/233.11 |

* cited by examiner

*Primary Examiner* — Tan T. Nguyen
(74) *Attorney, Agent, or Firm* — CKC & Partners Co., Ltd.

(57) ABSTRACT

A memory physical layer interface circuit electrically connected between a memory controller and a memory device is provided. The memory physical layer interface circuit includes a dock generation module and first-in-first-out (FIFO) modules. The clock generation module generates a reference clock signal and output related clock signals. The reference clock signal is transmitted to the memory device. Each of the FIFO modules writes the input information therein transmitted by the memory controller according to a write-related clock signal and retrieves the input information therefrom according to one of the output related clock signals to generate an output signal. The output signal is transmitted to the memory device to operate the memory device. The write-related clock signal is generated by dividing a frequency of one of the output related clock signals.

20 Claims, 5 Drawing Sheets

(1)

MEMORY SYSTEM AND MEMORY PHYSICAL LAYER INTERFACE CIRCUIT

RELATED APPLICATIONS

This application claims priority to Taiwan Application Serial Number 104114469, filed May 6, 2015, which is herein incorporated by reference.

BACKGROUND

Field of Invention

The present invention relates to a memory technology. More particularly, the present invention relates to a memory system and a memory physical layer interface of the same.

Description of Related Art

Along with the advancement of the performance of the processor, the memory technology needs to be developed to increase the speed of the memory devices as well. Take the double data rate synchronous dynamic random access memory (DDR SDRAM) as an example, the data processing speed supported by the DDR SDRAM is up to 3 Gbps. The clock cycle time is far smaller than the clock tree delay time of the memory physical layer circuit. The small clock cycle time results in the difficulties of the design of the memory physical layer circuit.

As a result, what is needed is a memory system and a memory physical layer interface of the same to increase the accuracy and the operation efficiency.

SUMMARY

An aspect of the present invention is to provide a memory physical layer interface circuit electrically connected between a memory controller and a memory device. The memory physical layer includes a clock generation module and a plurality of first-in-first-out (FIFO) modules. The clock generation module generates a reference clock signal and a plurality of output related clock signals, wherein the reference clock signal is transmitted to the memory device. Each of the FIFO modules writes an input information therein transmitted by the memory controller according to a write-related clock signal and retrieves the input information therefrom according to one of the output related clock signals to generate an output signal and to transmit the output signal to the memory device to operate the memory device, wherein the write-related clock signal is generated by dividing a frequency of one of the output related clock signals.

Another aspect of the present invention is to provide a memory system. The memory system includes a memory controller, a memory device and a memory physical layer interface circuit electrically connected between a memory controller and a memory device. The memory physical layer includes a clock generation module and a plurality of FIFO modules. The clock generation module generates a reference clock signal and a plurality of output related clock signals, wherein the reference clock signal is transmitted to the memory device. Each of the FIFO modules writes an input information therein transmitted by the memory controller according to a write-related clock signal and retrieves the input information therefrom according to one of the output related dock signals to generate an output signal and to transmit the output signal to the memory device to operate the memory device, wherein the write-related clock signal is generated by dividing a frequency of one of the output related clock signals.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
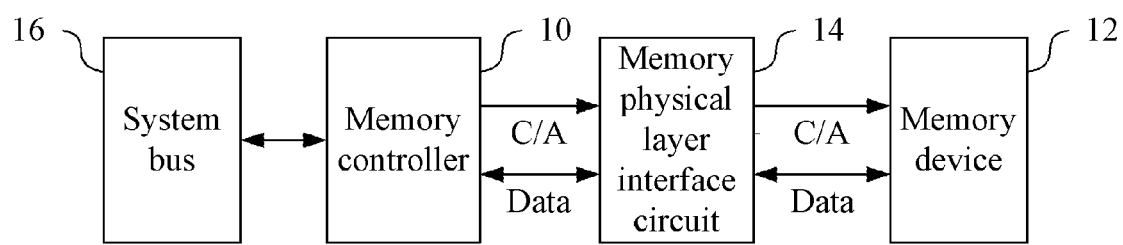
FIG. 1 is a block diagram of a memory system in an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Reference is now made to FIG. 1. FIG. 1 is a block diagram of a memory system 1 in an embodiment of the present invention. The memory system 1 includes a memory controller 10, a memory device 12 and a memory physical layer interface circuit 14.

As illustrated in FIG. 1, the memory physical layer interface circuit 14 is electrically connected between the memory controller 10 and the memory device 12. The memory controller 10 transmits a control signal C/A through the memory physical layer interface circuit 14 to access the data Data in the memory device 12.

Further, the memory controller 10 is connected to the system bus 16 to perform a communication with other circuit modules external to the memory system 1. For example, the memory system 1 can be disposed in a computer system (not illustrated) such that the processor (not illustrated) in the computer system can access the data stored in the memory device 12 through the system bus 16.

In an embodiment, the memory device 12 is a dynamic random access memory (DRAM). In an embodiment, the memory device 12 is a double data rate synchronous dynamic random access memory (DDR SDRAM).

Figure 2:
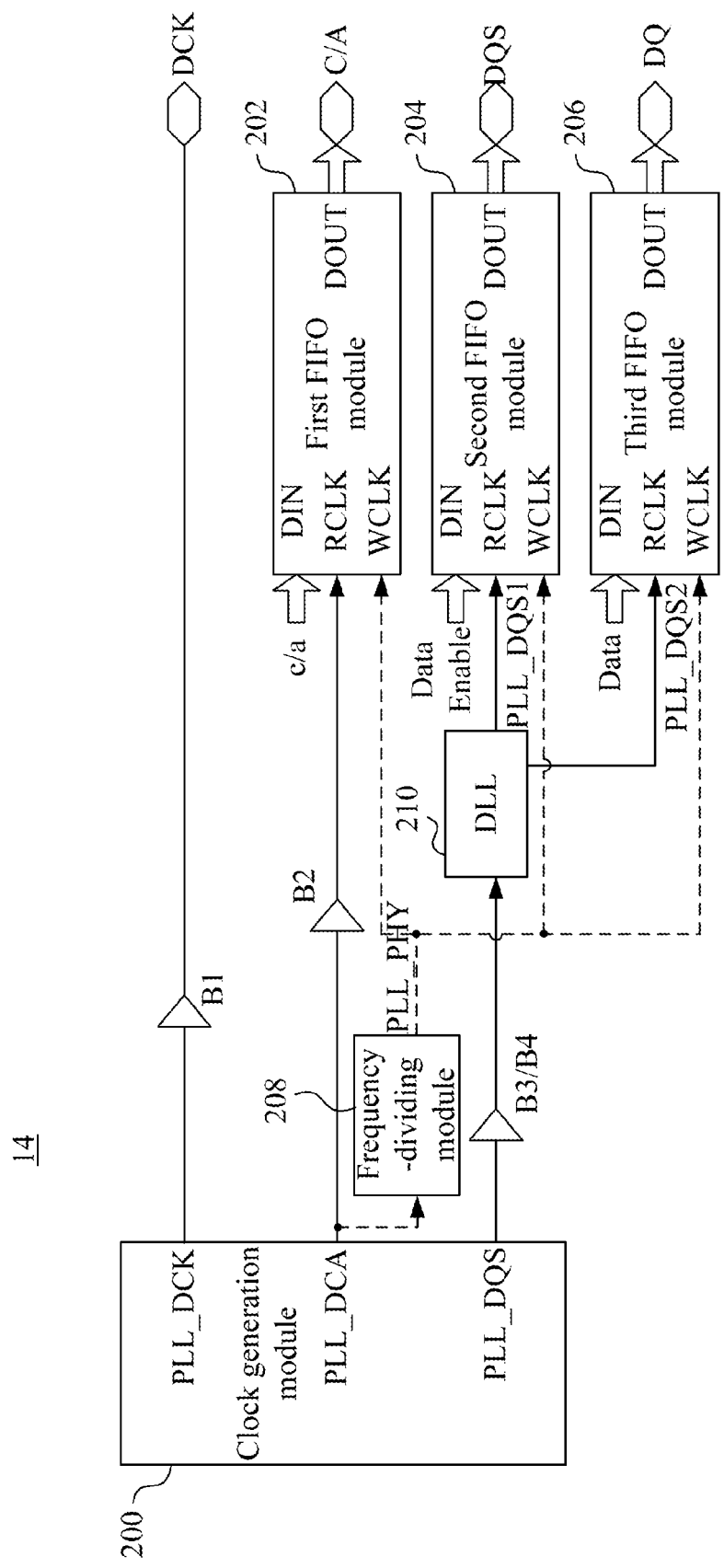
FIG. 2 is a block diagram of the memory physical layer interface circuit in an embodiment of the present invention.

Reference is now made to FIG. 2. FIG. 2 is a block diagram of the memory physical layer interface circuit 14 in an embodiment of the present invention. The memory physical layer interface circuit 14 includes a clock generation module 200 and a plurality of first-in-first-out (FIFO) modules. In the present embodiment, each of the FIFO modules includes a first FIFO module 202, a second FIFO module 204 and a third FIFO module 206.

The clock generation module 200 generates a reference clock signal PLL_DCK and a plurality of output related clock signals. In the present embodiment, the output related clock signals include, but not limited to, a control output clock signal PLL_DCA and a data output clock signal PLL_DQS.

The reference clock signal PLL_DCK is transmitted to the memory device 12 in FIG. 1 as a reference clock signal DCK such that the memory device 12 operates according to the reference clock signal DCK.

The first FIFO module 202 writes and stores the control information c/a transmitted by the memory controller 10 in FIG. 1 therein according to the write-related clock signal PLL_PHY. In an embodiment, the first FIFO module 202 receives the write-related clock signal PLL_PHY through the port WCLK to use the write-related clock signal PLL_PHY as the reference clock when the control information c/a is written. The first FIFO module 202 further receives the control information c/a through the port DIN to write the control information c/a into the storage unit (not illustrated) included in the first FIFO module 202.

In an embodiment, the write-related clock signal PLL_PHY is generated according to the control output clock signal PLL_DCA. In an embodiment, the memory physical layer interface circuit 14 further includes a frequency-dividing module 208 to receive the control output clock signal PLL_DCA and divide the frequency thereof to generate the write-related clock signal PLL_PHY.

It is appreciated that in other embodiments, the frequency-dividing module 208 can be disposed to perform the frequency-dividing process based on the reference clock signal PLL_DCK, the data output clock signal PLL_DQS or other possible clock signals to generate the write-related clock signal PLL_PHY and is not limited to the embodiment based on the control output clock signal PLL_DCA.

In different embodiments, the frequency-dividing module 208 can divide the frequency of the control output clock signal PLL_DCA by either 1 (i.e. same as the original frequency), by 2, by 4 or by other numbers to generate the write-related clock signal PLL_PHY.

By dividing the frequency, most of the logic units included in the first FIFO module 202 can selectively operate under the same frequency as the memory device 12 or operate at a frequency lower than that of the memory device 12.

In an embodiment, the first FIFO module 202 receives the control output clock signal PLL_DCA through the port RCLK. Subsequently, the first FIFO module 202 retrieves the control information c/a according to the control output clock signal PLL_DCA, generates the control signal C/A at the port DOUT and transmits the control signal C/A to the memory device 12 illustrated in FIG. 1. In an embodiment, the control signal C/A includes a command and an address such that the memory device 12 can be accessed accordingly. In an embodiment, the memory device 12 can sample the control signal C/A according to the reference clock signal DCK described above to retrieve the correct command and address based on the clock.

In an embodiment, the memory physical layer interface circuit 14 further includes a digital locked loop (DLL) 210 to perform a phase-shifting process on the data output clock signal PLL_DQS to generate a first data output clock signal PLL_DQS1 and a second data output clock signal PLL_DQS2 having different phases from each other.

The second FIFO module 204 writes and stores the data enable information Data Enable transmitted by the memory controller 10 in FIG. 1 therein according to the write-related clock signal PLL_PHY. In an embodiment, the second FIFO module 204 receives the write-related clock signal PLL_PHY through the port WCLK to use the write-related clock signal PLL_PHY as the reference clock when the data enable information Data Enable is written. The second FIFO module 202 further receives the data enable information Data Enable through the port DIN to write the data enable information Data Enable into the storage unit (not illustrated) included in the second FIFO module 204.

In an embodiment, the second FIFO module 204 receives the first data output clock signal PLL_DQS1 through the port RCLK. Subsequently, the second FIFO module 204 retrieves the data enable information Data Enable according to the first data output clock signal PLL_DQS1, generates a data strobe signal DQS at the port DOUT and transmits the data strobe signal DQS to the memory device 12 illustrated in FIG. 1.

The third FIFO module 206 writes and stores the data information Data transmitted by the memory controller 10 in FIG. 1 therein according to the write-related clock signal PLL_PHY. In an embodiment, the third FIFO module 206 receives the write-related clock signal PLL_PHY through the port WCLK to use the write-related clock signal PLL_PHY as the reference clock when the data information Data is written. The third FIFO module 206 further receives the data information Data through the port DIN to write the data information Data into the storage unit (not illustrated) included in the third FIFO module 206.

In an embodiment, the third FIFO module 206 receives the second data output clock signal PLL_DQS2 through the port RCLK. Subsequently, the third FIFO module 206 retrieves the data information Data according to the second data output clock signal PLL_DQS2, generates a data signal DQ at the port DOUT and transmits the data signal DQ to the memory device 12 illustrated in FIG. 1. The memory device 12 further receives the data signal DQ according to the data strobe signal DQS.

In an embodiment, the memory physical layer interface circuit 14 further includes clock trees B1, B2, B3 and B4. The clock tree B1 is connected between the clock generation module 200 and the memory device 12 to transmit the reference dock signal DCK. The dock tree B2 is actually connected among the first FIFO module 202, the dock generation module 200 and the memory device 12 to act as a path to transmit the control output clock signal PLL_DCA and the control signal C/A. However, in order to give a clear description, the clock tree B2 is exemplarily illustrated to be connected between the first FIFO module 202 and the clock generation module 200.

The clock tree B3 is actually connected among the second FIFO module 204, the clock generation module 200 and the memory device 12 to act as a path to transmit the first data output clock signal PLL_DQS1 and the data strobe signal DQS. The clock tree B4 is actually connected among the third FIFO module 206, the clock generation module 200 and the memory device 12 to act as a path to transmit the second data output clock signal PLL_DQS2 and the data signal DQ. However, in order to give a clear description, the clock trees B3 and B4 are exemplarily illustrated to be connected between the second FIFO module 200 and the clock generation module 200 and between the third FIFO module 206 and the clock generation module 200.

By disposing the first FIFO module 202, the second FIFO module 204 and the third FIFO module 206, the length of the clock trees B2, B3 and B4 can be greatly reduced. In an embodiment, the clock trees B1, B2, B3 and B4 mentioned above are balance. In other words, the delay time of the signal transmitted through the clock trees B1, B2, B3 and B4 are basically the same.

As a result, from the above description, the first to the third FIFO modules 202, 204 and 206 can effectively reduce the length of the clock trees for signal transmission to increase the operation efficiency of the memory device 12.

Moreover, the first to the third FIFO modules 202, 204 and 206 can write the related input information synchronously according to the same write-related clock signal PLL_PHY, and the write-related clock signal PLL_PHY can be generated by dividing the frequency of the control output clock signal PLL_DCA or other clock signals. Most of the internal components in the first to the third FIFO modules 202, 204 and 206 can therefore be operated at a lower frequency. The timing of the auto place and route (APR) is easier to converge.

Besides, the signal generated by the first to the third FIFO modules 202, 204 and 206 can be outputted according to different output related clock signal. The timing of these signals can be adjusted more elastically.

Figure 3:
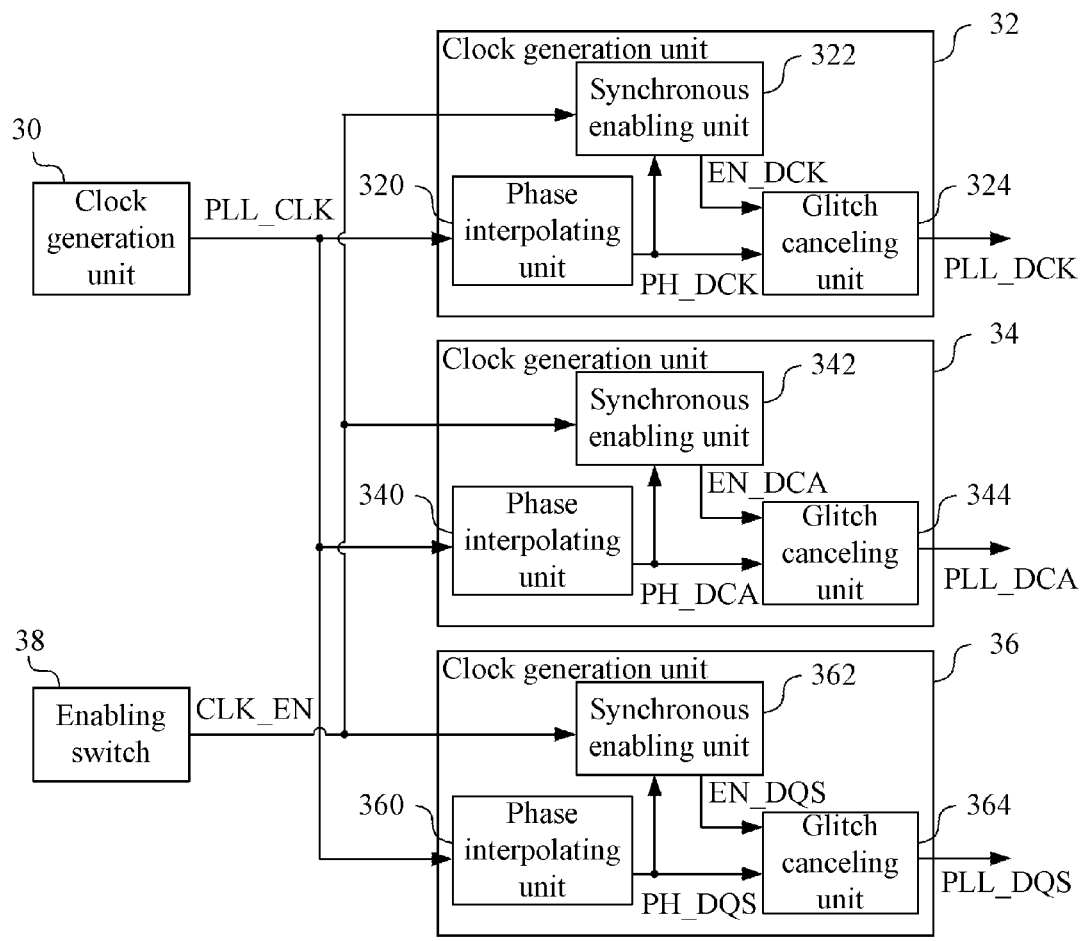
FIG. 3 is a block diagram of the clock generation module in an embodiment of the present invention.

Reference is now made to FIG. 3 at the same time. FIG. 3 is a block diagram of the clock generation module 200 in an embodiment of the present invention.

The clock generation module 200 includes a clock generation unit 30 and a plurality of clock output units 32, 34 and 36. The clock generation unit 30 generates an original clock signal PLL_CLK. The clock output units 32, 34 and 36 respectively generates the reference clock signals PLL_DCK, the control output clock signal PLL_DCA and the data output clock signal PLL_DQS according to the original clock signal PLL_CLK and an enabling signal CLK_EN.

Figure 4:
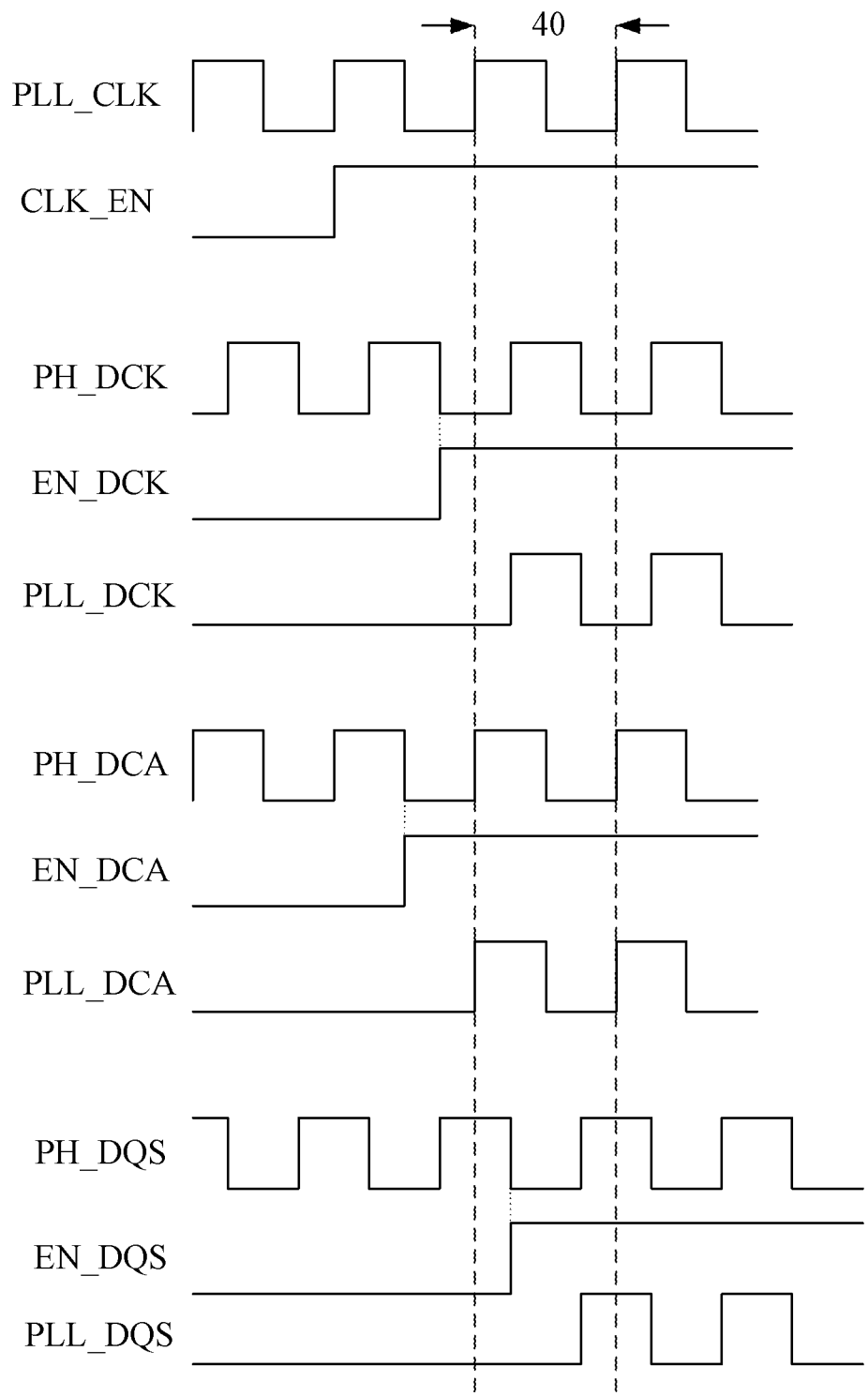
FIG. 4 is a diagram of the waveforms of the original clock signal, the enabling signal, the reference clock signals, the control output clock signal, the data output clock signal and other internal signals in an embodiment of the present invention.

Reference is now made to FIG. 4 at the same time. FIG. 4 is a diagram of the waveforms of the original clock signal PLL_CLK, the enabling signal CLK_EN, the reference clock signals PLL_DCK, the control output clock signal PLL_DCA, the data output dock signal PLL_DQS and other internal signals in an embodiment of the present invention.

The clock output unit 32 includes a phase interpolating unit 320, a synchronous enabling unit 322 and a glitch canceling unit 324. The phase interpolating unit 320 performs a phase-shifting on the original clock signal PLL_CLK to generate a phase-shifted clock signal PH_DCK. In the present embodiment, the phase-shifted clock signal PH_DCK is phase-shifted by 90 degrees relative to the original clock signal PLL_CLK.

The synchronous enabling unit 322 generates a synchronous enabling signal EN_DCK according to the enabling signal CLK_EN and the phase-shifted clock signal PH_DCK. It is appreciated that in the present embodiment, the enabling signal CLK_EN can be generated by an enabling switch 38 included in the clock generation module 200. In an embodiment, the synchronous enabling unit 322 starts to generate the synchronous enabling signal EN_DCK at a negative edge of the waveform within a period corresponding to the phase-shifted clock signal PH_DCK after the synchronous enabling unit 322 receives the enabling signal CLK_EN.

The glitch canceling unit 324 is conducted according to the synchronous enabling signal EN_DCK to output the phase-shifted clock signal PH_DCK as the reference clock signal PLL_DCK.

The clock output unit 34 includes a phase interpolating unit 340, a synchronous enabling unit 342 and a glitch canceling unit 344. The phase interpolating unit 340 performs a phase-shifting on the original clock signal PLL_CLK to generate a phase-shifted clock signal PH_DCA. In the present embodiment, the phase-shifted clock signal PH_DCA is phase-shifted by 0 degree relative to the original clock signal PLL_CLK. In other words, the phase-shifted clock signal PH_DCA is actually in phase with the original clock signal PLL_CLK.

The synchronous enabling unit 342 generates a synchronous enabling signal EN_DCA according to the enabling signal CLK_EN and the phase-shifted clock signal PH_DCA. In an embodiment, the synchronous enabling unit 342 starts to generate the synchronous enabling signal EN_DCA at a negative edge of the waveform within a period corresponding to the phase-shifted clock signal PH_DCA after the synchronous enabling unit 342 receives the enabling signal CLK_EN.

The glitch canceling unit 344 is conducted according to the synchronous enabling signal EN_DCA to output the phase-shifted clock signal PH_DCA as the control output clock signal PLL_DCA.

The clock output unit 36 includes a phase interpolating unit 360, a synchronous enabling unit 362 and a glitch canceling unit 364. The phase interpolating unit 360 performs a phase-shifting on the original clock signal PLL_CLK to generate a phase-shifted clock signal PH_DQS. In the present embodiment, the phase-shifted clock signal PH_DQS is phase-shifted by 270 degree relative to the original clock signal PLL_CLK.

The synchronous enabling unit 362 generates a synchronous enabling signal EN_DQS according to the enabling signal CLK_EN and the phase-shifted clock signal PH_DQS. In an embodiment, the synchronous enabling unit 362 starts to generate the synchronous enabling signal EN_DQS at a negative edge of the waveform within a period corresponding to the phase-shifted dock signal PH_DQS after the synchronous enabling unit 362 receives the enabling signal CLK_EN.

The glitch canceling unit 364 is conducted according to the synchronous enabling signal EN_DQS to output the phase-shifted clock signal PH_DQS as the data output clock signal PLL_DQS.

In an embodiment, the synchronous enabling units 342 and 362 corresponding to the phase-shifted clock signals PH_DCA and PH_DQS generates the synchronous enabling signals EN_DCA and EN_DQS within a same period, such as the period 40 illustrated in FIG. 4. As a result, the control output clock signal PLL_DCA and the data output clock signal PLL_DQS are generated with in the same period. The drawback of not being able to subsequently access the data signal DQ accurately according to the command in the control signal C/A results from the non-consistent timing can be avoided.

Consequently, the advantage of the present invention is the ability of controlling the transmission timing of each of the signals by disposing the clock generation module 200 in the memory physical layer interface circuit 14. The accuracy of the memory device 12 is thus increased.

Figure 5:
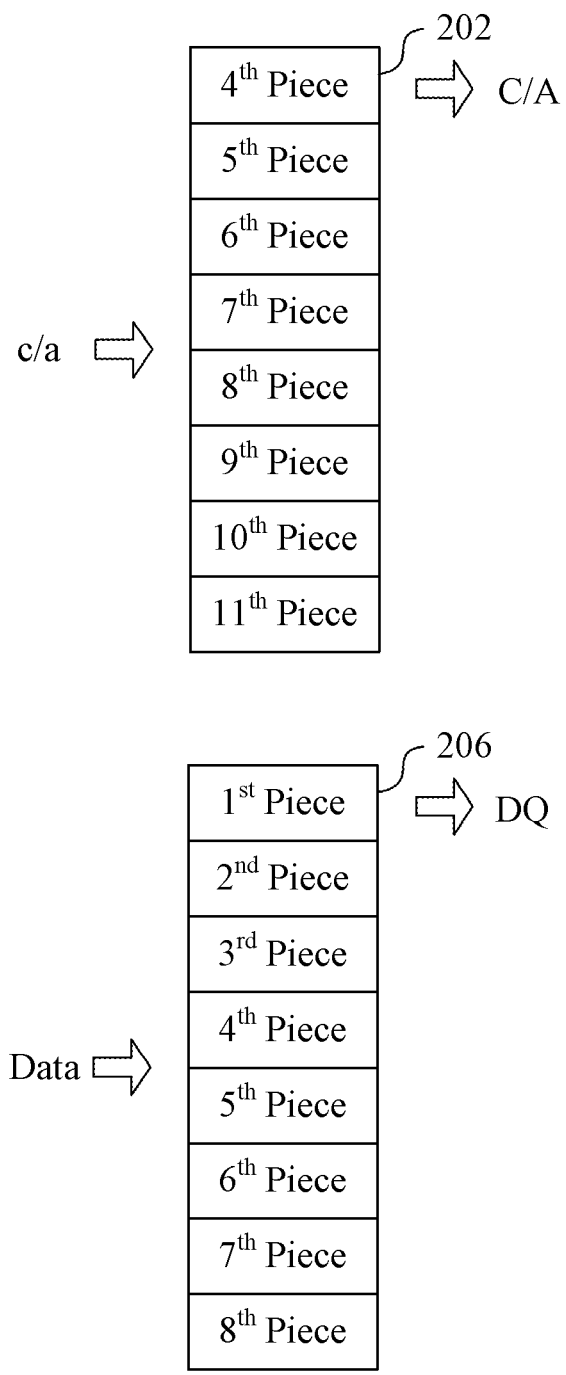
FIG. 5 is a diagram of the first FIFO module and the third FIFO module in an embodiment of the present invention.

Reference is now made to FIG. 5. FIG. 5 is a diagram of the first FIFO module 202 and the third FIFO module 206 in an embodiment of the present invention.

In an embodiment, the first FIFO module 202 and the third FIFO module 206 are configured to output the corresponding control signal C/A and the data signal DQ separated by a predetermined delay time from each other. Take the modules illustrated in FIG. 5 as an example, the first FIFO module 202 and the third FIFO module 206 are configured such that the data signal DQ is outputted later than the control signal C/A by three timing slots. Therefore, the third FIFO module 206 starts to generate the first piece of data signal DQ when the first FIFO module 202 is about to generate the fourth pieces of the control signal C/A.

Consequently, the memory physical layer interface circuit 14 can perform more elastic adjustment on the output timings of different signals to match the need of the memory device 12.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A memory physical layer interface circuit electrically connected between a memory controller and a memory device, wherein the memory physical layer interface circuit comprises:
   a clock generation module to generate a reference clock signal and a plurality of output related clock signals, wherein the reference clock signal is transmitted to the memory device; and
   a plurality of first-in-first-out (FIFO) modules where each of the FIFO modules is to write an input information therein transmitted by the memory controller according to a write-related clock signal and to retrieve the input information therefrom according to one of the output related clock signals to generate an output signal and to transmit the output signal to the memory device to operate the memory device, wherein the write-related clock signal is generated by dividing a frequency of one of the output related clock signals.

2. The memory physical layer interface circuit of claim 1, further comprising a frequency-diving module to receive one of the output related clock signals to divide the frequency of the received one of the output related clock signals and generate the write-related clock signal.

3. The memory physical layer interface circuit of claim 1, wherein the output related clock signals comprises an output control clock signal, the FIFO modules comprises a first FIFO module to write a control information therein transmitted by the memory controller according to the write-related clock signal, to retrieve the control information therefrom according to the output control clock signal to generate a control signal and to transmit the control signal to the memory device.

4. The memory physical layer interface circuit of claim 3, wherein the control signal is a command and an address.

5. The memory physical layer interface circuit of claim 1, wherein the output related clock signals comprises a data output clock signal, the memory physical layer interface circuit further comprises a digital locked loop (DLL) to perform a phase-shifting on the data output clock signal to generate a first data output signal and a second data output signal having different phases;
   the FIFO modules comprises a second FIFO module to write a data enable information therein transmitted by the memory controller according to the write-related clock signal, to retrieve the data enable information therefrom according to the first data output clock signal to generate a data strobe signal and to transmit the data strobe signal to the memory device; and
   the FIFO modules comprises a third FIFO module to write a data information therein transmitted by the memory controller according to the write-related clock signal, to retrieve the data information according to the second data output signal to generate a data signal and to transmit the data signal to the memory device such that the memory device receives the data signal according to the data strobe signal.

6. The memory physical layer interface circuit of claim 1, further comprising:
   a first clock tree connected between the clock generation module and the memory device to transmit the reference clock signal; and
   a plurality of second clock trees each correspondingly connected to one of the FIFO modules and between the clock generation module and the memory device and each to act as a path to transmit one of the output related clock signals and the output signal;
   wherein the first clock tree and the second clock trees are balance.

7. The memory physical layer interface circuit of claim 1, wherein the clock generation module further comprises:
   a clock generation unit to generate an original clock signal; and
   a plurality of clock output units each comprising:
      a phase interpolating unit to perform a phase-shifting on the original clock signal to generate a phase-shifted clock signal;
      a synchronous enabling unit to generate a synchronous enabling signal according to an enabling signal and the phase-shifted clock signal; and
      a glitch canceling unit to be conducted according to the synchronous enabling signal to output the phase-shifted clock signal as one of the output related clock signals and the reference clock signal.

8. The memory physical layer interface circuit of claim 7, wherein the synchronous enabling unit comprised in each of the clock output units starts to generate the synchronous enabling signal at a negative edge of a waveform within a period corresponding to the phase-shifted dock signal after the synchronous enabling unit receives the enabling signal.

9. The memory physical layer interface circuit of claim 7, wherein the synchronous enabling unit comprised in each of the clock output units that correspondingly generates the output related clock signals generates the synchronous enabling signal within the same period.

10. The memory physical layer interface circuit of claim 1, wherein at least two of the FIFO modules are configured to output the corresponding output signal separated by a predetermined delay time from each other.

11. A memory system comprises:
   a memory controller;
   a memory device; and
   a memory physical layer interface circuit electrically connected between the memory controller and the memory device, wherein the memory physical layer interface circuit comprises:
      a clock generation module to generate a reference clock signal and a plurality of output related clock signals, wherein the reference clock signal is transmitted to the memory device; and
      a plurality of FIFO modules where each of the FIFO modules is to write an input information therein transmitted by the memory controller according to a write-related clock signal and to retrieve the input information therefrom according to one of the output related clock signals to generate an output signal and to transmit the output signal to the memory device to operate the memory device, wherein the write-related clock signal is generated by dividing a frequency of one of the output related clock signals.

12. The memory system of claim 11, wherein the memory physical layer interface circuit further comprises a frequency-diving module to receive one of the output related clock signals to divide the frequency of the received one of the output related clock signals and generate the write-related clock signal.

13. The memory system of claim 11, wherein the output related clock signals comprises an output control clock signal, the FIFO modules comprises a first FIFO module to write a control information therein transmitted by the memory controller according to the write-related clock signal, to retrieve the control information therefrom according to the output control clock signal to generate a control signal and to transmit the control signal to the memory device.

14. The memory system of claim 13, wherein the control signal is a command and an address.

15. The memory system of claim 11, wherein the output related clock signals comprises a data output clock signal, the memory physical layer interface circuit further comprises a DLL to perform a phase-shifting on the data output clock signal to generate a first data output signal and a second data output signal having different phases;
the FIFO modules comprises a second FIFO module to write a data enable information therein transmitted by the memory controller according to the write-related clock signal, to retrieve the data enable information therefrom according to the first data output clock signal to generate a data strobe signal and to transmit the data strobe signal to the memory device; and
the FIFO modules comprises a third FIFO module to write a data information therein transmitted by the memory controller according to the write-related clock signal, to retrieve the data information according to the second data output signal to generate a data signal and to transmit the data signal to the memory device such that the memory device receives the data signal according to the data strobe signal.

16. The memory system of claim 11, wherein the memory physical layer interface circuit further comprises:
a first clock tree connected between the clock generation module and the memory device to transmit the reference clock signal; and
a plurality of second clock trees each correspondingly connected to one of the FIFO modules and between the clock generation module and the memory device and each to act as a path to transmit one of the output related clock signals and the output signal;
wherein the first clock tree and the second clock trees are balance.

17. The memory system of claim 11, wherein the clock generation module further comprises:
a clock generation unit to generate an original clock signal; and
a plurality of clock output units each comprising:
a phase interpolating unit to perform a phase-shifting on the original clock signal to generate a phase-shifted clock signal;
a synchronous enabling unit to generate a synchronous enabling signal according to an enabling signal and the phase-shifted clock signal; and
a glitch canceling unit to be conducted according to the synchronous enabling signal to output the phase-shifted clock signal as one of the output related clock signals and the reference clock signal.

18. The memory system of claim 17, wherein the synchronous enabling unit comprised in each of the clock output units starts to generate the synchronous enabling signal at a negative edge of a waveform within a period corresponding to the phase-shifted clock signal after the synchronous enabling unit receives the enabling signal.

19. The memory system of claim 17, wherein the synchronous enabling unit comprised in each of the clock output units that correspondingly generates the output related clock signals generates the synchronous enabling signal within the same period.

20. The memory system of claim 11, wherein at least two of the FIFO modules are configured to output the corresponding output signal within a predetermined delay time of each other.

* * * * *